(12) United States Patent
Yellin et al.

(10) Patent No.: US 7,912,145 B2
(45) Date of Patent: Mar. 22, 2011

(54) FILTER FOR A MODULATOR AND METHODS THEREOF

(75) Inventors: Daniel Yellin, Ra'anana (IL); Kobby Pick, Modiin (IL)

(73) Assignee: Marvell World Trade Ltd., St. Michael (BB)

( * ) Notice: Subject to any disclaimer, the term of this patent is extended or adjusted under 35 U.S.C. 154(b) by 776 days.

(21) Appl. No.: 10/734,117

(22) Filed: Dec. 15, 2003

(65) Prior Publication Data

US 2005/0129142 A1   Jun. 16, 2005

(51) Int. Cl.
H04L 27/00   (2006.01)

(52) U.S. Cl. .................................. 375/295; 375/302

(58) Field of Classification Search .......... 375/295–300, 375/302–303, 305, 308
See application file for complete search history.

(56) References Cited

U.S. PATENT DOCUMENTS

| | | |
|---|---|---|
| 3,777,275 A | 12/1973 | Cox |
| 4,063,199 A | 12/1977 | Oursler, Jr. |
| 4,433,312 A | 2/1984 | Kahn |
| 4,439,744 A | 3/1984 | Kumar et al. |
| 5,012,200 A | 4/1991 | Meinzer |
| 5,264,807 A | 11/1993 | Okubo et al. |
| 5,295,162 A | 3/1994 | Zarembowitch |
| 5,302,914 A | 4/1994 | Arntz et al. |
| 5,345,189 A | 9/1994 | Hornak et al. |
| 5,420,541 A | 5/1995 | Upton et al. |
| 5,541,554 A | 7/1996 | Stengel et al. |
| 5,548,246 A | 8/1996 | Yamamoto et al. |
| 5,568,094 A | 10/1996 | Bowen et al. |
| 5,621,351 A | 4/1997 | Puri et al. |
| 5,661,434 A | 8/1997 | Brozovich et al. |
| 5,694,093 A | 12/1997 | DaSilva et al. |
| 5,724,005 A | 3/1998 | Chen et al. |
| 5,739,723 A | 4/1998 | Sigmon et al. |
| 5,758,269 A | 5/1998 | Wu |
| 5,786,727 A | 7/1998 | Sigmon |
| 5,786,728 A | 7/1998 | Alinikula |
| 5,854,571 A | 12/1998 | Pinckley et al. |
| 5,862,460 A | 1/1999 | Rich |
| 5,872,481 A | 2/1999 | Sevic et al. |
| 5,880,633 A | 3/1999 | Leizerovich et al. |
| 5,886,575 A | 3/1999 | Long |
| 5,901,346 A | 5/1999 | Stengel et al. |
| 5,903,854 A | 5/1999 | Abe et al. |

(Continued)

FOREIGN PATENT DOCUMENTS

WO   WO 99/52206   10/1999

OTHER PUBLICATIONS

U.S. Appl. No. 10/131,750, filed Apr. 24, 2002, Barak et al.

(Continued)

*Primary Examiner* — Chieh M. Fan
*Assistant Examiner* — Freshteh N Aghdam

(57) ABSTRACT

In some exemplary embodiments of the invention, a transfer function of a filter for a fractional-N sigma-delta modulator may be calculated to be optimized according to predefined optimization criteria. For example, the optimization criteria may include spectral cleanliness at the output of the modulator, or the mean squared error of the input to the filter and the input to a voltage controlled oscillator of the fractional-N phase locked loop (PLL). In some exemplary embodiments, the filter may be adjusted to compensate for variations and/or impairments in the analog fractional-N PLL. A non-exhaustive list of examples for the transfer function includes a finite impulse response and an infinite impulse response.

5 Claims, 6 Drawing Sheets

U.S. PATENT DOCUMENTS

| | | | |
|---|---|---|---|
| 5,909,643 | A | 6/1999 | Aihara |
| 5,929,702 | A | 7/1999 | Myers et al. |
| 5,974,041 | A | 10/1999 | Kornfeld et al. |
| 6,008,703 | A * | 12/1999 | Perrott et al. .................. 332/100 |
| 6,047,029 | A * | 4/2000 | Eriksson et al. .............. 375/247 |
| 6,101,224 | A * | 8/2000 | Lindoff et al. ................ 375/300 |
| 6,133,788 | A | 10/2000 | Dent |
| 6,147,653 | A | 11/2000 | Wallace et al. |
| 6,181,920 | B1 | 1/2001 | Dent et al. |
| 6,201,452 | B1 | 3/2001 | Dent et al. |
| 6,271,782 | B1 | 8/2001 | Steensgaard-Madsen |
| 6,285,251 | B1 | 9/2001 | Dent et al. |
| 6,330,455 | B1 | 12/2001 | Ichihara |
| 6,490,440 | B1 | 12/2002 | Mielke et al. |
| 6,587,511 | B2 | 7/2003 | Barak et al. |
| 6,633,199 | B2 | 10/2003 | Nielsen et al. |
| 6,636,112 | B1 | 10/2003 | McCune |
| 6,754,287 | B2 | 6/2004 | Underbrink et al. |
| 6,825,719 | B1 | 11/2004 | Barak et al. |
| 2003/0078016 | A1 * | 4/2003 | Groe et al. ....................... 455/91 |
| 2003/0123566 | A1 * | 7/2003 | Hasson .......................... 375/279 |
| 2003/0125065 | A1 | 7/2003 | Hasson et al. |
| 2003/0206056 | A1 | 11/2003 | Hietala |
| 2004/0041638 | A1 * | 3/2004 | Vilcocq et al. .................. 331/16 |
| 2005/0058219 | A1 * | 3/2005 | Liu ............................... 375/295 |
| 2007/0036238 | A1 * | 2/2007 | Matero et al. ................. 375/296 |

OTHER PUBLICATIONS

Fredrick H. Raab, "Efficiency of Outphasing RF Power-Amplifier Systems", IEEE Transactions on Communications. vol. Com-33, No. 10, Oct. 1985, pp. 1094-1099.

Steve C. Cripps, "RF Power Amplifiers for Wireless Communications", 1999, USA, pp. 219-250.

D.C. Cox, "Linear Amplification with Nonlinear Components", IEEE Transaction on Communications, Dec. 1974, pp. 1942-1945.

Bob Stengel and William R. Eisenstadt, "LINC Power Amplifier Combiner Method Efficiency Optimization", IEEE Transaction on Vehicular Technology. vol. 49, No. 1, Jan. 2000, pp. 229-234.

Bob Stengel, "LINC Linear Transmitter Technology Review", Presented at International Microwave Symposium, Boston, MA, Jun. 11, 2000, pp. 1-32.

S.A. Hetzel et al., "A LINC Transmitter", University of Bristol, IEEE, 1999, pp. 133-137.

S. O. Ampem-Darko, H.S. Al-Raweshidy, "A Novel Technique for Gain/Phase Error Cancellation in LINC Transmitters", 1999 IEEE, pp. 2034-2038.

T.A. D. Riley and M. A. Copeland, "A simplified continuous phase modulator technique," IEEE Trans. on circuits and systems, vol. 41, No. 5, pp. 321-328, May 1994.

N. M. Filiol, T. A. D. Riley, C. Plett and M. A. Copeland, "An agile ISM band frequency synthesizer with built-in GMSK data modulation," IEEE Journal of Solid-State Circuits, vol. 33, No. 7, pp. 998-1008, Jul. 1998.

T. Yamaji, A. Yasuda, H. Tanimoto, Y. Suzuki, "A Digital-to-RF Converter Architecture Suitable for a Digital-to-RF Direct-Conversion Software Defined Radio Transmitter", IEICE Trans. Commun., vol. E83-B, No. 6, pp. 1254-1260, Jun. 2000.

J. Nieznanski, "Performance characterization of vector sigma-delta modulation", IECON '98, Proceedings of the 24th Annual Conference of the IEEE, vol. 1, pp. 531-536, 1998.

Zhang et al., "Multibit Oversampled Sigma—Delta A/D Convertor with Nonuniform Quantisation", Electronics Letters, Mar. 14, 1991, UK, vol. 27, No. 6, pp. 528-529.

D.L. Neuhoff, "Polar quantization revisited", IEEE International Symposium on Information Theory, 1997 Proceedings, pp. 60, 1997.

N.O. Sokal, "RF Power Amplifiers, Classes A through S—How they operate, and when to use each", Electronics Industries Forum of New England, Professional Program Proceedings, pp. 179-183, 1997.

Perrott et al., "27-MW CMOS Fractional-N Synthesizer Using Digital Compensation for 2.5-MB/S GFSK Modulation", IEEE Journal of Solid-State Circuits, IEEE Inc., New York. USA, vol. 32, No. 12, Dec. 1, 1997, pp. 2048-2080.

M. H. Perrott, "Techniques for High Data Rate modulation and Low Power Operation of Fractional-N Frequency Synthesizers", PH.D Disseration, MIT, Sep. 1997, Retrieved from the Internet, URL:http://www-mtl.mIt.edu/(perrott/pages/thesis.pdf/, pp. 1-90.

International Search Report from PCT/US2004/010959, mailed on Oct. 7, 2004.

Michael H. Perrott et al., "A Modeling Approach for $\Sigma$-$\Delta$ Fractional-$N$ Frequency Synthesizers Allowing Straightforward Noise Analysis", IEEE Journal of Solid-State Circuits, vol. 37, No. 8, Aug. 2002, pp. 1028-1038.

"Parallelism exploitation is SAR data compression methods", Beatriz Botero, Nourredine Hifdi, EUSAR 2000, Munich, Allemagne, May 23-25, 2000.

Peric et al., "Design of Signal Constellations for Gaussian Channel by Using Iterative Polar Quantization", Electrotechnical Conference, 1998 MELECON 98., 9th Mediterranean, vol. 2, May 18-20, 1998 pp. 866-869 vol. 2 Digital Object Identifier.

* cited by examiner

FILTER FOR A MODULATOR AND METHODS THEREOF

BACKGROUND OF THE INVENTION

In polar modulation, a signal is separated into its instantaneous amplitude and phase/frequency components (rather than into the classical in-phase (I) and quadrature (Q) components), and the amplitude component and phase/frequency component are modulated independently. The amplitude component may be modulated with any suitable amplitude modulation (AM) technique, while the phase/frequency component may be modulated using an analog phase locked loop (PLL).

To allow reasonable operation, the bandwidth of the PLL may be quite small, much smaller than the actual bandwidth of the transmission signal's instantaneous phase/frequency. For example, in the case where the PLL is fed by a sigma-delta converter that has a high pass noise nature, the loop filter may be narrow enough to attenuate the sigma-delta quantization noise and the phase noise of the PLL. A pre-emphasis filter may emphasize, prior to modulation, those frequency components that would be attenuated by the PLL. The pre-emphasis filter may employ inverse filtering to the linearized response of the PLL. This inverse filtering may yield a high-order infinite impulse response (IIR), which may suffer from stability problems.

Conventional practice involves calibration mechanisms in order to accurately calibrate the PLL to the predefined pre-emphasis filter. Without calibration, there is a risk that the pre-emphasis filter will not match the inverse to the PLL closed loop transfer function, which may result in enhancement of the phase noise.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF THE INVENTION

In the following detailed description, numerous specific details are set forth in order to provide a thorough understanding of embodiments of the invention. However it will be understood by those of ordinary skill in the art that embodiments of the invention may be practiced without these specific details. In other instances, well-known methods, procedures, components and circuits have not been described in detail so as not to obscure the description of embodiments of the invention.

Figure 1:
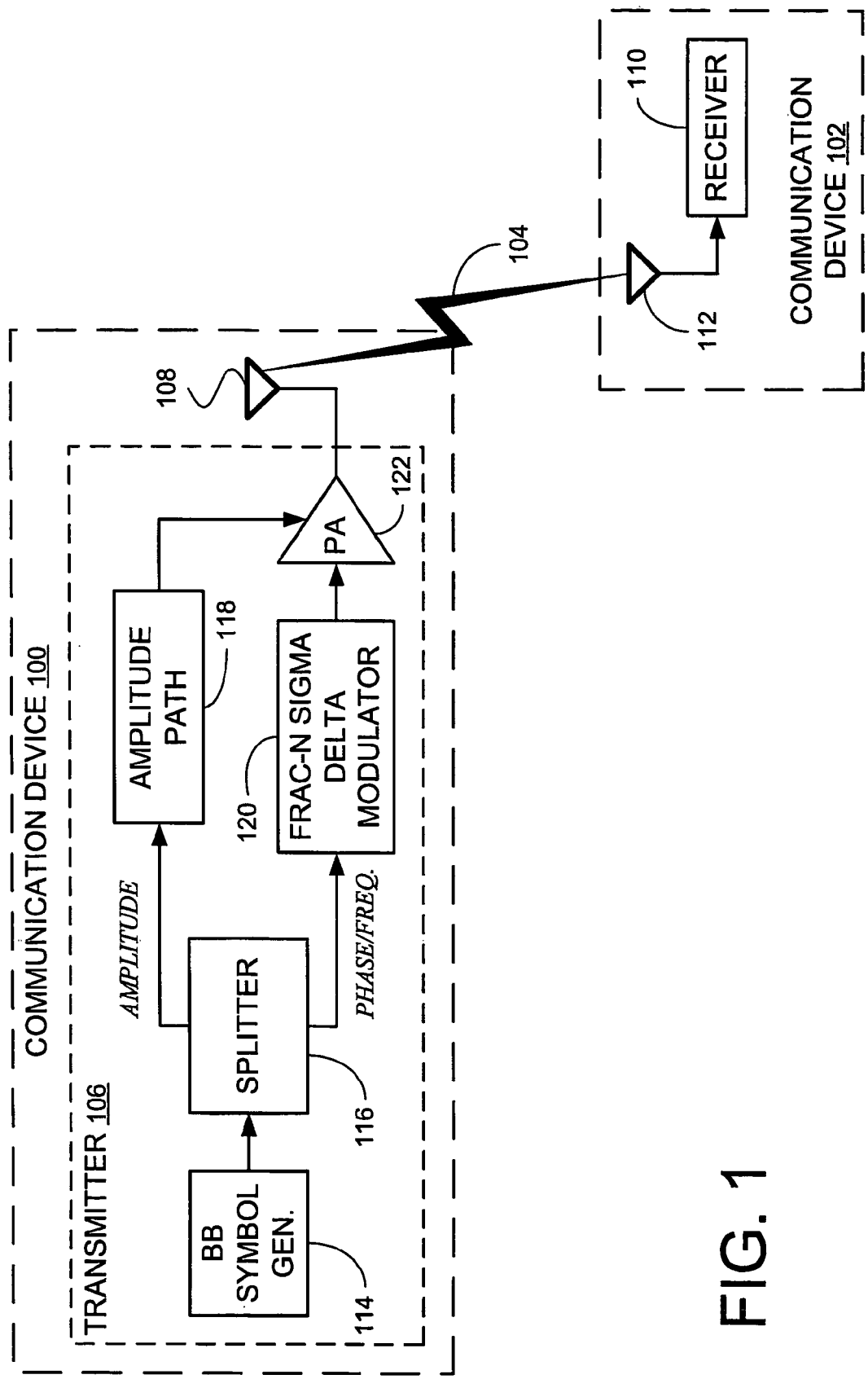
FIG. 1 is a block-diagram illustration of an exemplary communication system including a transmitter according to some embodiments of the invention.

FIG. 1 is a block-diagram illustration of an exemplary communication system including a transmitter according to an embodiment of the invention. A communication device 100 is able to communicate with a communication device 102 over a communication channel 104. Although the scope of the invention is not limited in this respect, the communication system shown in FIG. 1 may be part of a cellular communication system (with one of communication devices 100, 102 being a base station and the other a mobile station, or with both communication devices 100, 102 being mobile stations), a pager communication system, a personal digital assistant and a server, etc. A non-exhaustive list of examples for the communication system shown in FIG. 1 includes a Global System for Mobile Communications (GSM) system, a General Packet Radio Service (GPRS) system, an Enhanced Data for GSM Evolution (EDGE) system, code division multiple access (CDMA), CDMA2000, Wideband-CDMA (WCDMA), AMPS and any other wireless standard.

Communication device 100 may include at least a transmitter 106 and an antenna 108. Communication device 102 may include at least a receiver 110 and an antenna 112. Antennas 108 and 112 may be of any desired kind such as, but not limited to, dipole, Yagi and multi-pole and the like. Moreover, communication device 100 may include a receiver (not shown). Similarly, communication device 102 may include a transmitter (not shown).

Transmitter 106 may include at least a baseband symbol generator 114 to generate a signal of baseband symbols, a splitter 116 to split the signal into its instantaneous amplitude and phase/frequency components, an amplitude path 118 to modulate and amplify the amplitude components, a fractional-N sigma-delta modulator 120 to modulate and up-convert the phase/frequency components, and a power amplifier 122 to amplify the output of fractional-N sigma-delta modulator 120 with a gain controlled by the output of amplitude path 118. Antenna 108 is coupled to power amplifier 122 to transmit the output of power amplifier 122.

Baseband symbol generator 114 may be implemented in accordance with a wireless standard. Splitter 116 may be implemented in hardware, software or firmware or any combination thereof.

Figure 2:
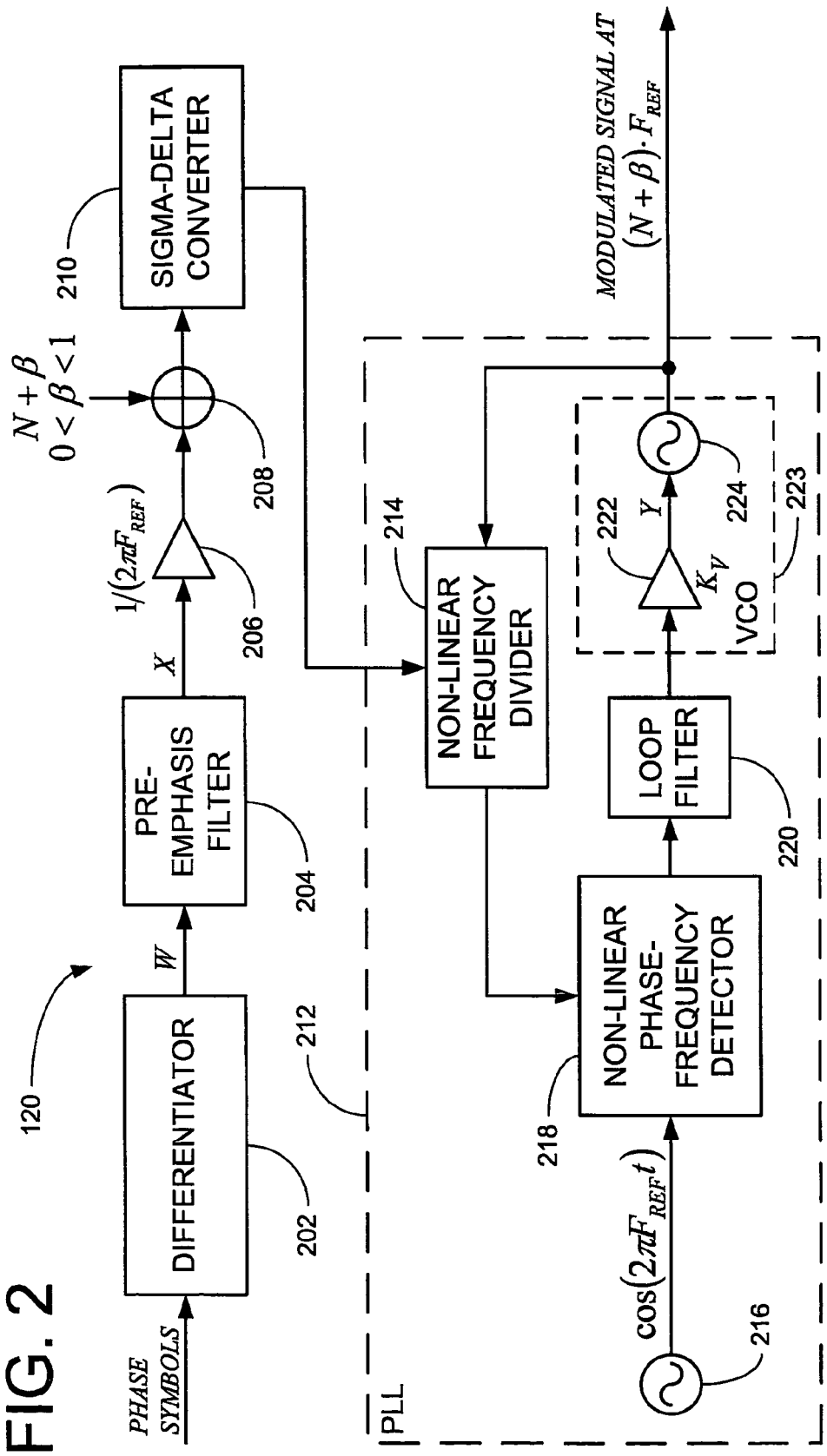
FIG. 2 is a block-diagram illustration of an exemplary fractional-N sigma-delta modulator according to some embodiments of the invention.

FIG. 2 is a block-diagram illustration of an exemplary fractional-N sigma-delta modulator according to an embodiment of the invention, such as, for example, fractional-N sigma-delta modulator 120 of FIG. 1. Fractional-N sigma-delta modulator 120 has a digital portion and an analog portion. The digital portion may include at least a differentiator 202, a filter 204 (such as, for example, a pre-emphasis filter), an amplifier 206, a summer 208, and a sigma-delta converter 210. The analog portion, which implements an analog phase locked loop (PLL) 212, may include at least a non-linear frequency divider 214, a reference oscillator 216 to produce a signal having a frequency $F_{REF}$, a non-linear phase-frequency detector 218, a loop filter 220, an amplifier 222 having a gain $K_V$, and a voltage-controlled oscillator (VCO) 224. The input of VCO 224 is denoted Y. PLL 212 is also known as a "fractional-N phase locked loop" unit. Amplifier 222 and VCO 224 may be implemented as a single unit (VCO 223); the separation into two elements is for the sake of analysis.

Reference oscillator 216 may produce a signal having a reference frequency $F_{REF}$. An example of reference frequency $F_{REF}$ is approximately 26 MHz, although other reference frequencies may be used instead.

Differentiator 202 may differentiate the phase symbols received from splitter 116 of FIG. 1 to obtain the instantaneous frequency W of the baseband signal. Differentiator 202 may be implemented in hardware, software or firmware or any combination thereof.

Filter 204 may be determined so that the instantaneous frequency W is transferred to the input Y of VCO 224 with little or no distortion, as will be described in more detail hereinbelow. Any implementation of a digital filter is suitable for filter 204.

Amplifier 206 may normalize the output of filter 204, denoted X, to PLL reference frequency units.

Summer 208 may add the output of amplifier 206 with a number N+β. Both the integer number N and the non-integer number β having a value between 0 and 1 may be set according to an instruction from a base station regarding the average output frequency of a transmitter of a mobile station. For example, if reference frequency $F_{REF}$ is approximately 26 MHz, then N may have a value in the range of 29-32 so that N·$F_{REF}$ has a value of approximately 800 MHz.

Sigma-delta converter 210 may convert the output of summer 208 into an integer number that represents the instantaneous frequency division ratio of the PLL.

Non-linear frequency divider 214 may divide the output of VCO 224 by the integer number provided by sigma-delta converter 210 to produce a divided-frequency signal.

Non-linear phase-frequency detector 218 may compare the divided-frequency signal to the reference frequency signal produced by reference oscillator 216. Non-linear phase-frequency detector 218 may produce a control signal that corresponds to the phase difference and/or frequency difference between the two signals. Any implementation of a phase-frequency detector is suitable for phase-frequency detector 218.

The control signal, after smoothing by loop filter 220 and amplification by amplifier 222, may be applied to VCO 224 so that VCO 224 synthesizes a modulated output carrier signal.

As mentioned above, filter 204 may be determined so that the instantaneous frequency W is transferred to the input Y of VCO 224 with little or no distortion (e.g. the overall response from W to Y is close to flat in the frequencies of interest).

Figure 3:
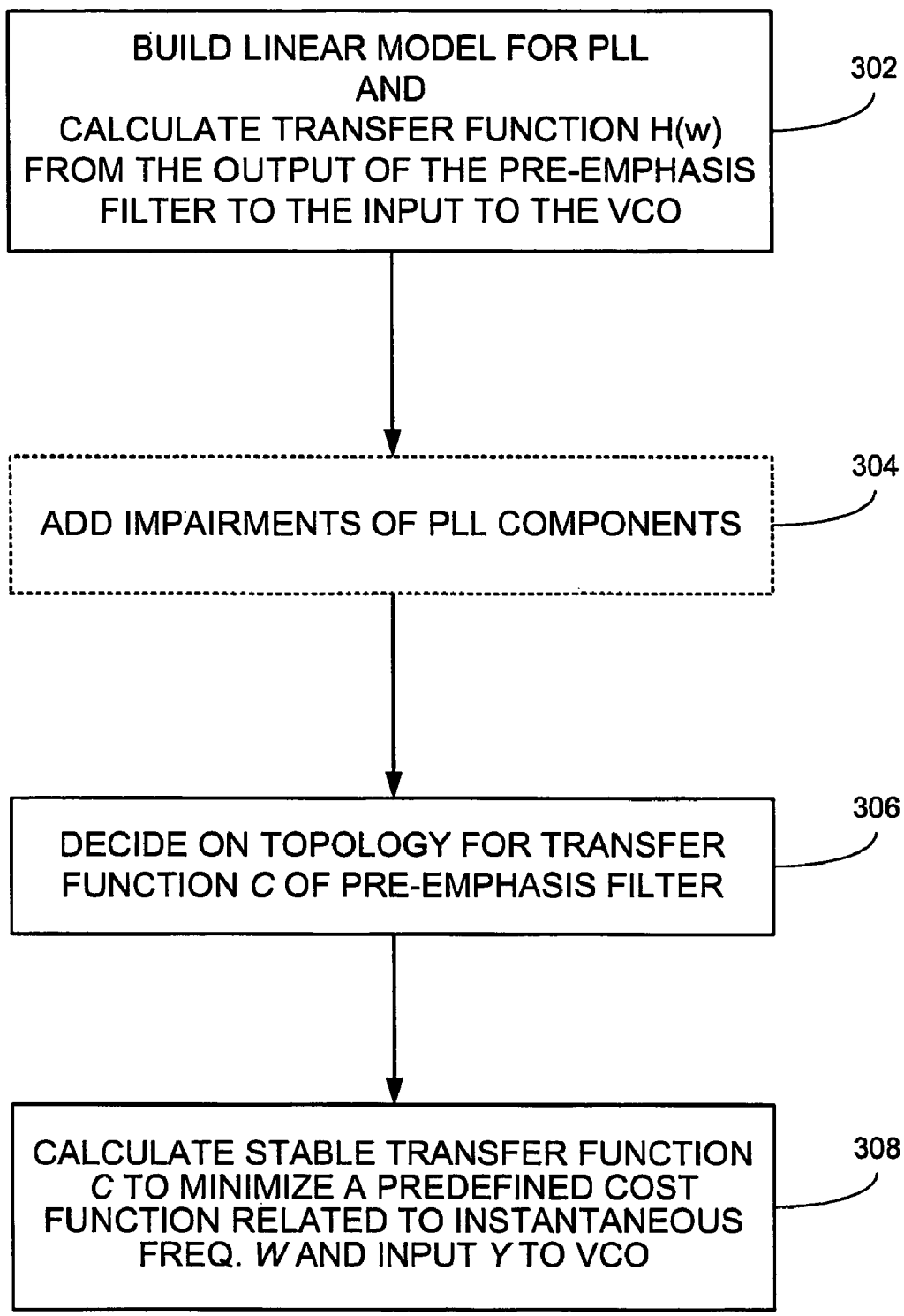
FIG. 3 is a flowchart illustration of an exemplary method to determine a transfer function of a filter, according to some embodiments of the invention.

FIG. 3 is a flowchart illustration of an exemplary method to determine a transfer function C of filter 204, according to an embodiment of the invention. The method may include the following:

a) building a linear model for PLL 212 and calculating the transfer function H(w) from the output X of filter 204 to the input Y to VCO 224 (block 302);

b) optionally adding various impairments of the different PLL components (e.g. phase noises, variations of the PLL parameters from their nominal values, and the like) to the model (block 304)—the variations of PLL parameters from their nominal values, such as, for example, capacitors, resistors, open loop gain, etc., may be due to production inaccuracies;

c) deciding on a topology for the transfer function C of filter 204 (block 306), and d) calculating a transfer function C to minimize a predefined cost function related to the instantaneous frequency W and the input Y to VCO 224 (block 308).

In some embodiments, the transfer function C is a stable transfer function.

Mathematically, the transfer function C may be expressed as follows:

$$C = \mathrm{ArgMin}_C\{\mathrm{Cost}(W,Y)\}.$$

In one embodiment, the cost function may be the mean square error (MSE) between the instantaneous frequency W and the input Y to VCO 224, as follows: $\mathrm{Cost}(W,Y)=E\{|W(t)-Y(t)|^2\}$, where t is a time variable and E is an expectation operator. In yet another embodiment, the expectation operator is replaced by time averaging and the cost function becomes:

$$\mathrm{Cost}(W, Y) = \frac{1}{T} \int_{-T/2}^{T/2} |W(t) - Y(t)|^2 dt$$

where T is a design parameter determining the integration time window.

In another embodiment, the cost function may be a weighted MSE in the frequency domain, as follows:

$$\mathrm{Cost}(W, Y) = E\left\{ \int_{-\infty}^{+\infty} P(w)|W(w) - Y(w)|^2 dw \right\},$$

where P(w) is a user-defined, positive, weight function. For example, weight function P(w) may give more weight to those frequencies where spectral cleanliness is more important.

In other embodiments, other cost functions may be used, such as, for example, a cost function that measures the spectral cleanliness of the overall transmission signal.

In the event that an MSE or weighted MSE cost function is used, then block 304 of the method may be redundant if all impairments may be represented as additive noise terms, since different choices of transfer function C will not affect that total contribution of these additive impairments to the MSE or weighted MSE cost.

Certain cost functions may be minimized using equalization theory, as will be described hereinbelow for a particular example.

Any suitable topology for transfer function C may be used in block 306. For example, transfer function C may be a finite impulse response (FIR) of order p (in which case stability is guaranteed), or an infinite impulse response (IIR) having a rational transfer function of orders (p,q), etc.

Figure 4:
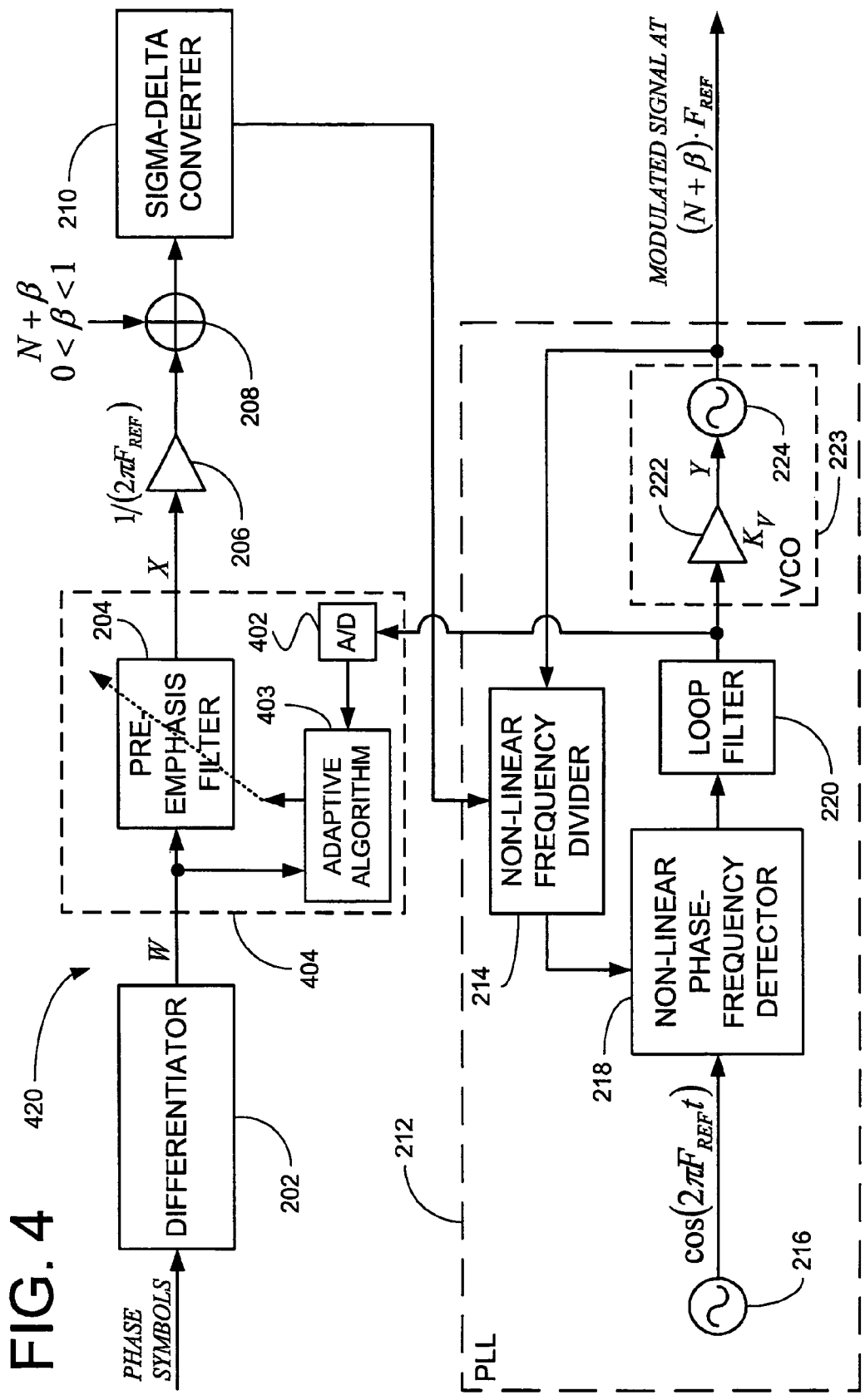
FIG. 4 is a block-diagram illustration of an exemplary fractional-N sigma-delta modulator including an adaptive filter, according to some embodiments of the invention.

FIG. 4 is a block diagram of an exemplary fractional-N sigma-delta modulator 420 including an adaptive filter, according to some embodiments of the invention. Fractional-N sigma-delta modulator 420 is similar to fractional-N sigma-delta modulator 120 of FIG. 2, and therefore similar components are referenced with the same reference numerals and will not be described in further detail. Fractional-N sigma-delta modulator 420 may include at least an adaptive filter 404 (such as, for example, an adaptive pre-emphasis filter). Adaptive filter 404 may include at least filter 204, an analog-to-digital (A/D) converter 402 and an adaptive algorithm 403.

Adaptive algorithm 403 compares the input to filter 204 (the instantaneous frequency W) to the input to VCO 223 (after digitization). Adaptive algorithm 403 adapts filter 204 according to the comparison. For example, if the error between instantaneous frequency W and input Y is defined by a particular cost function, then adaptive algorithm 403 may reduce the error iteratively. A non-exhaustive list of examples of adaptive mechanisms include Least Mean Squares (LMS), Recursive Least Squares (RLS), and the like. Thus, any impairments, offsets, drifts, etc. of the analog portion of the PLL may drive the filter values to those values that minimize a pre-specified adaptive mechanism cost function such as, for example, a mean squared error cost function. Variations in the PLL, such as for example, variations in temperature, voltage, aging, etc., may be compensated for by the adaptive algorithm.

Since adaptive algorithm 403 enables the digital values of filter 204 to be adapted to variations in the analog PLL, it may not be necessary to calibrate PLL 212 to predefined values for filter 204.

Figure 5:
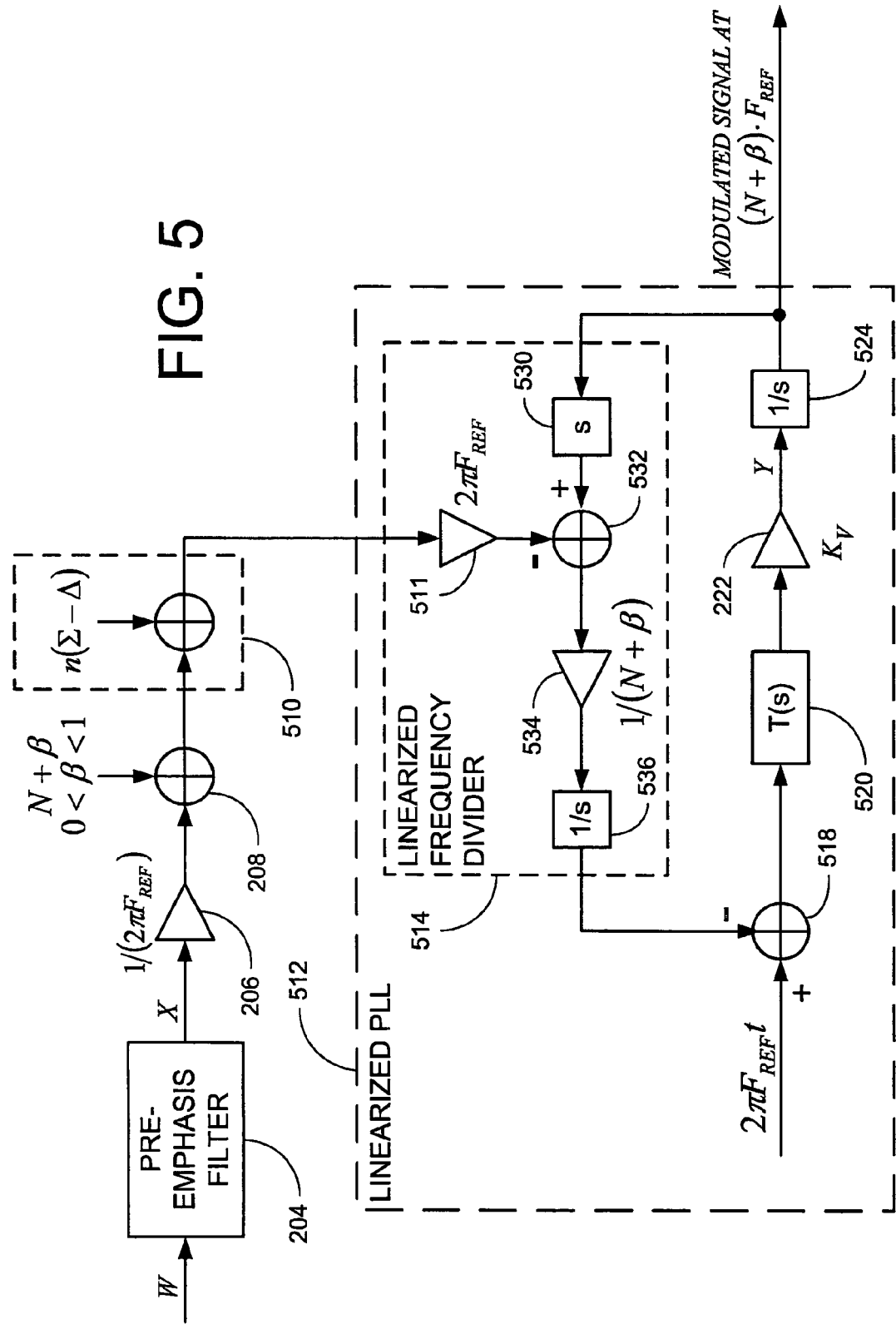
FIG. 5 is a block-diagram illustration of an exemplary linearized approximation to the exemplary fractional-N sigma-delta modulator of FIG. 2, according to some embodiments of the invention.

Block 302 of the method of FIG. 3 includes building a linear model of a PLL. FIG. 5 is a block diagram of an exemplary linearized approximation to the exemplary fractional-N sigma-delta modulator of FIG. 2. In this approximation, which is made in the phase domain, PLL 212 has been approximated by a linearized PLL 512, and sigma-delta converter 210 has been approximated by a linearized sigma-delta converter 510 including an all pass filter and an additive noise $n(\Sigma-\Delta)$.

Non-linear frequency divider 214 has been approximated by a linearized frequency divider 514 including an amplifier 511 having a gain of $2\pi F_{REF}$, a differentiator block 530 having a transfer function of s, where s is a Laplace domain variable, a subtraction block 532, an amplifier 534 having a gain of $1/(N+\beta)$, and an integrator block 536 having a transfer function of 1/s.

VCO 224 has been approximated by a block 524 having a transfer function of 1/s. Non-linear phase-frequency detector 218 has been approximated by a subtraction block 518, and loop filter 220 has been approximated by a block 520 having a transfer function T(s).

The transfer function from the output X of filter 204 to input Y to block 524 is then given by the following expression:

$$\frac{Y(s)}{X(s)} = \frac{(K_V/(N+\beta)) \cdot T(s)/s}{1 + (K_V/(N+\beta)) \cdot T(s)/s} \quad \text{(Equation 1)}$$

The design of the transfer function C of filter 204 may then be performed as follows. In order that the instantaneous frequency W be transferred to the input Y of VCO 224 with little or no frequency and phase distortion, the overall transfer function from W to Y may be of substantially 0 dB gain up to a cut-off frequency $f_0$ and may have substantially linear phase up to the cut-off frequency $f_0$.

The cut-off frequency $f_0$ may be defined experimentally by observing the spectrum of the instantaneous frequency W signal. Alternatively, the cut-off frequency $f_0$ may be defined as narrow as possible while still meeting the requirements of a communication standard. Other definitions of the cut-off frequency $f_0$ are also within the scope of the invention.

One straightforward solution is to define the transfer function C from W to X up to the cut-off frequency $f_0$ as the inverse IIR to the transfer function Y(s)/X(s), as given by the following expression:

$$\frac{X(s)}{W(s)} = \frac{1 + (K_V/(N+\beta)) \cdot T(s)/s}{(K_V/(N+\beta)) \cdot T(s)/s}, \quad \text{(Equation 2)}$$

$$s = j \cdot 2\pi f, f < f_0$$

where j is the square root of −1.

However, if the transfer function C were implemented as the inverse IIR to the transfer function Y(s)/X(s), then the following problems might arise:
a) zeros and poles may need to be added to the inverse IIR to stabilize the filter;
b) additional poles or filters may need to be added to the inverse IIR to attenuate the frequencies above the cut-off frequency $f_0$ so that the sigma-delta converter will not be forced into saturation and so as not to increase the quantization noise; and
c) the order of the transfer function C would no longer be a design parameter; rather, it would have a one-to-one relation to the order of the closed loop transfer function. Therefore, according to some embodiments of the present invention, the transfer function C is not the inverse IIR to the transfer function Y(s)/X(s). Rather, the transfer function C of the filter is calculated to optimize predefined optimization criteria, as described hereinabove with respect to FIG. 3.

Figure 6:
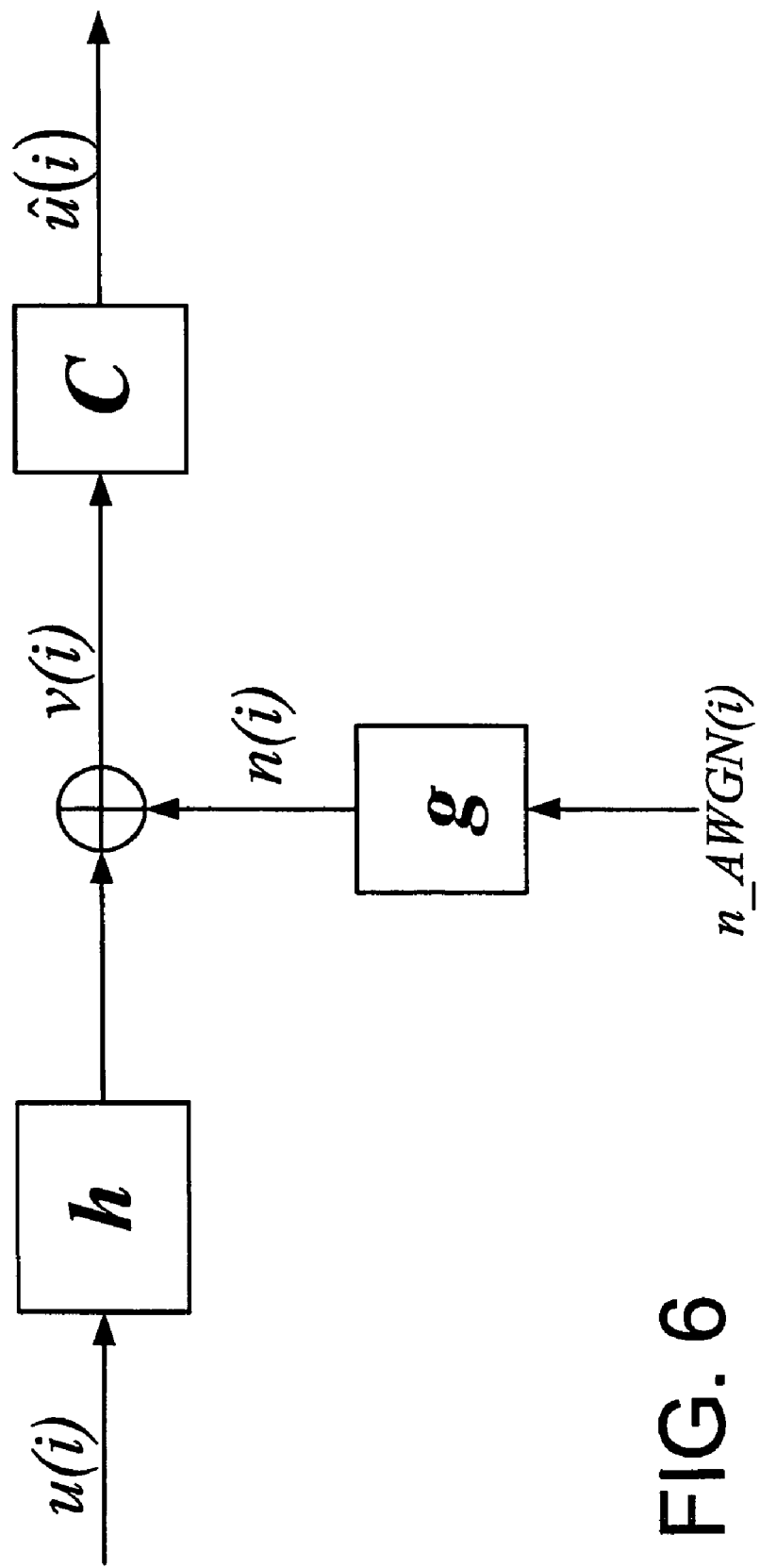
FIG. 6 is a block diagram of an exemplary system including an equalizer.

Block 302 of the method of FIG. 3 includes calculating the transfer function C to minimize a predefined cost function related to the instantaneous frequency W and the input Y to the VCO of the PLL. The transfer function C may be calculated in a manner similar to the calculation of a minimum mean squared error (MMSE) equalizer, as will be explained in greater detail. FIG. 6 is a block diagram of an exemplary system including an equalizer.

A known digital input signal u(i) may be subjected to an impulse response h, where the impulse response h is defined as the bi-linear transform of the transfer function Y(s)/X(s).

An additive white Gaussian noise n_AWGN(i) may be shaped by a shaping filter g. Noise shaping filter g may be a high pass filter with a cut-off above frequency $f_0$, so that the equalizer response at high frequencies will be attenuated.

The combination of shaped noise n(i) and the output of impulse response h is denoted v(i). The digital signal v(i) may be subjected to a FIR filter C to yield a digital signal û(i).

FIR filter C may be calculated analytically to minimize the mean square error that is defined as $$e \equiv u(i) - \hat{u}(i). \quad \text{(Equation 3)}$$

The following expressions may be useful in the calculation of FIR filter C:

$$\hat{u}(i) = \overline{C}^H \cdot \overline{V}, \quad \text{(Equation 4a)}$$

$$\overline{V} = H \cdot \overline{U} + \overline{N}, \quad \text{(Equation 4b)}$$

$$H \equiv \begin{bmatrix} h(M+L) & \cdots & h(L) & \cdots & h(-M+L) \\ \vdots & & \vdots & & \vdots \\ h(M) & & h(0) & & h(-M) \\ \vdots & & \vdots & & \vdots \\ h(M-L) & \cdots & h(-L) & \cdots & h(-M-L) \end{bmatrix}_{(2L+1)\times(2M+1)}, \quad \text{(Equation 4c)}$$

$$\overline{U} \equiv \begin{bmatrix} u(i-M) \\ \vdots \\ u(i) \\ \vdots \\ u(i+M) \end{bmatrix}_{(2M+1)\times 1}, \quad \text{(Equation 4d)}$$

-continued $$\overline{N} \equiv \begin{bmatrix} n(i+L) \\ \vdots \\ n(i) \\ \vdots \\ u(i-L) \end{bmatrix}_{(2L+1)\times 1}, \quad \text{(Equation 4e)}$$

where the bar denotes vector notation, the superscript H denotes the conjugate transpose, 2M+1 is assumed to be the length (i.e. number of coefficients) of impulse response h, and 2L+1 is assumed to be the length (i.e. number of coefficients) of the equalizer.

The following assumptions may be made:
1. There is no correlation between the error and the observations. Thus, $E\{e(i) \cdot \overline{V}^H\} = \overline{0}^H$, where, again, E is an expectation operator.
2. There is no correlation between the input signal and the shaped noise. Thus $E\{e(i) \cdot n(i+k)^*\} = 0$, $\forall k$, where the asterisk denotes the complex conjugate.
3. The input signal is independently distributed (ID). Thus $$E\{u(i) \cdot u(i+k)^*\} = \begin{cases} \sigma_U^2(i), & k=0 \\ 0, & k \neq 0 \end{cases}, \text{ where } \sigma_U^2(i) = E\{\cdot |u(i)|^2\}.$$

4. n_AWGN is additive white Gaussian noise. Thus $$E\{\text{n\_AWGN}(i) \cdot \text{n\_AWGN}(i+k)^*\} = \begin{cases} \sigma_{N\_AWGN}^2, & k=0 \\ 0, & k \neq 0 \end{cases},$$

where $\sigma_{N\_AWGN}^2 = E\{\cdot |\text{n}_{13} \text{AWGN}(i)|^2\}$ is a fixed value for all i.
From assumption 1 it follows that $$E\{u(i) \cdot \overline{V}^H\} = E\{\hat{u}(i) \cdot \overline{V}^H\}. \quad \text{(Equation 5)}$$

By substituting Equations 4a, 4b, 4d and 4e into Equation 5, it follows that:

$$\begin{aligned} E\{\hat{u}(i) \cdot \overline{V}^H\} &= \overline{C}^H \cdot E\{\overline{V} \cdot \overline{V}^H\} \quad \text{(Equation 6)} \\ &= \overline{C}^H \cdot E\{(H \cdot \overline{U} + \overline{N}) \cdot (\overline{U}^H \cdot H^H + \overline{N}^H)\} \\ &= \overline{C}^H \cdot [E\{H \cdot \overline{U} \cdot \overline{U}^H \cdot H^H\} + E\{\overline{N} \cdot \overline{N}^H\}], \\ &= \overline{C}^H \cdot [H \cdot H^H \cdot \sigma_U^2 + G \cdot G^H \cdot \sigma_{N\_AWGN}^2] \end{aligned}$$

where for simplicity, $\sigma_U^2(i)$ is denoted by $\sigma_U^2$, and where matrix G is defined in terms of shaping filter g in a similar manner to the definition of matrix H in terms of impulse response h.

Similarly, using Equation 4b and assumptions 2 and 3, it follows that:

$$\begin{aligned} E\{u(i) \cdot \overline{V}^H\} &= E\{u(i) \cdot (H \cdot \overline{U} + \overline{N})\} \quad \text{(Equation 7)} \\ &= \sigma_U^2 \cdot [h(L) \ldots h(0) \ldots h(-L)] \end{aligned}$$

From Equations 5, 6 and 7, and applying the complex conjugate operator, the MMSE analytical calculation of the FIR filter C is as follows:

$$C = [H \cdot H^H \cdot \sigma_U^2 + G \cdot G^H \cdot \sigma_{N\_AWGN}^2]^{-1} \cdot \begin{bmatrix} h(L) \\ \vdots \\ h(0) \\ \vdots \\ h(-L) \end{bmatrix} \cdot \sigma_U^2. \quad \text{(Equation 8)}$$

FIR filter C may be calculated empirically. For example, a simulation environment may be built in which u(i) is the instantaneous frequency at the baseband, h(i) is the total response from the input to the sigma-delta converter until the input to the VCO, shaping filter g(i) is chosen so that shaped noise n(i) will be a high pass noise a cutoff frequency of which is beyond the band of interest of the total response. A simulation may then be run to determine empirical values for v(i). The following quantities may then be calculated:

$$R_{VV} = \frac{1}{L} \cdot \sum_{k=0}^{L-1} \overline{V}(i-k) \cdot \overline{V}^H(i-k), \text{ and} \quad \text{(Equation 9a)}$$

$$R_{VU} = \frac{1}{L} \cdot \sum_{k=0}^{L-1} \overline{V}(i-k) \cdot u^*(i-k). \quad \text{(Equation 9b)}$$

The empirically calculated FIR MMSE filter is then given by:

$$\overline{C} = R_{VV}^{-1} \cdot \overline{R}_{VU}. \quad \text{(Equation 9c)}$$

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A communication device comprising: a baseband symbol generator; a dipole antenna; and a power amplifier coupled to said dipole antenna, the power amplifier being configured to receive a first output of said baseband symbol generator from a signal path that includes a fractional-N sigma-delta modulator having a pre-emphasis filter, to receive a second output of the baseband symbol generator, and to amplify the first output with a gain that is controlled by a varying amplitude of the second output;
    wherein said fractional-N sigma-delta modulator includes at least:
    a sigma-delta converter coupled to the pre-emphasis filter; and a fractional-N phase locked loop unit coupled to an output of said sigma-delta converter,
    wherein a transfer function of said pre-emphasis filter is to be optimized according to predefined optimization criteria, and
    wherein said optimization criteria are related to an input to said pre-emphasis filter, and are further related to an input to a voltage controlled oscillator of the fractional-N phase locked loop unit and not to an output to the voltage controlled oscillator of the fractional-N phase locked loop.

2. The communication device of claim 1, wherein said transfer function of said pre-emphasis filter is a finite impulse response.

3. The communication device of claim 1, wherein said optimization criteria includes a mean squared error of said input to said pre-emphasis filter and the input to a voltage controlled oscillator of said fractional-N phase locked loop unit.

4. The communication device of claim 1, further comprising:
an adaptive filter to compare said input to said pre-emphasis filter and said input to said voltage controlled oscillator and to adapt the optimization criteria in accordance with a result of said comparison.

5. The communication device of claim 4, wherein said adaptive filter includes an analog-to-digital (A/D) converter coupled to said input to said voltage controlled oscillator.

* * * * *